United States Patent [19]

Miyamoto et al.

[11] Patent Number: 4,694,427
[45] Date of Patent: Sep. 15, 1987

[54] PROGRAMMABLE SEMICONDUCTOR MEMORY DEVICE WITH COMBINED SENSE AMPLIFICATION AND PROGRAMMING CAPABILITY

[75] Inventors: Junichi Miyamoto; Jun-ichi Tsujimoto, both of Yokohama, Japan

[73] Assignee: Kabushiki Kaisha Toshiba, Kawasaki, Japan

[21] Appl. No.: 759,433

[22] Filed: Jul. 26, 1985

[30] Foreign Application Priority Data

Sep. 21, 1984 [JP] Japan .................. 59-197925

[51] Int. Cl.$^4$ ............................. G11C 11/40
[52] U.S. Cl. .................... 365/185; 365/210; 365/205
[58] Field of Search .............. 365/184, 185, 189, 104, 365/210, 205, 207, 208

[56] References Cited

U.S. PATENT DOCUMENTS

| 4,031,524 | 6/1977 | Heeren ................................ 365/104 |
| 4,223,394 | 9/1980 | Pathak et al. .................... 365/210 |
| 4,459,684 | 7/1984 | Chapman ........................... 365/184 |

FOREIGN PATENT DOCUMENTS

0100232  8/1979  Japan ................... 365/205

OTHER PUBLICATIONS

Chao et al, "CMOS Sense Restore Circuits for One Device FET Dynamic RAM", *IBM Tech. Disc. Bull.*, vol. 25, No. 10, Mar. 1983, pp. 5088-5091.
"Nikkei Electronics Journal", pp. 171-184, Jan. 16, 1984.

*Primary Examiner*—James W. Moffitt
*Assistant Examiner*—Glenn A. Gossage
*Attorney, Agent, or Firm*—Finnegan, Henderson, Farabow, Garrett & Dunner

[57] ABSTRACT

A semiconductor memory device provided with first and second bit lines, each of which is connected to a memory cell comprising a nonvolatile transistor and a dummy cell comprising a nonvolatile transistor. The first and second bit lines are respectively connected to high voltage generators which are applied at the time of data programming. At the time of data reading, data-detecting and storing means comprising a flip-flop circuit detects data, while amplifying a potential difference between the first and second bit lines. At the time of data writing, the data detecting and storing means temporarily stores data in accordance with the contents of externally supplied writing data. A first switching transistor is provided between the first data input-output node of the data-detecting and storing means and the first bit line. The second switching transistor is connected between the second data input-output node of the data-detecting and storing means and second bit line. The paired switching transistors are controlled in accordance with the operation mode of the memory device.

6 Claims, 7 Drawing Figures

FIG. 4A  $\overline{WE}$  
FIG. 4B  DATA  
FIG. 5
|  | D | SG | CG | S | Vth | LOGIC |
|---|---|---|---|---|---|---|
| DATA ERASING | 0V | 20V | 20V | 0V | +5V | "1" |
| DATA PROGRAMMING | 20V | 20V | 0V | 5V | -1V | "0" |
FIG. 6
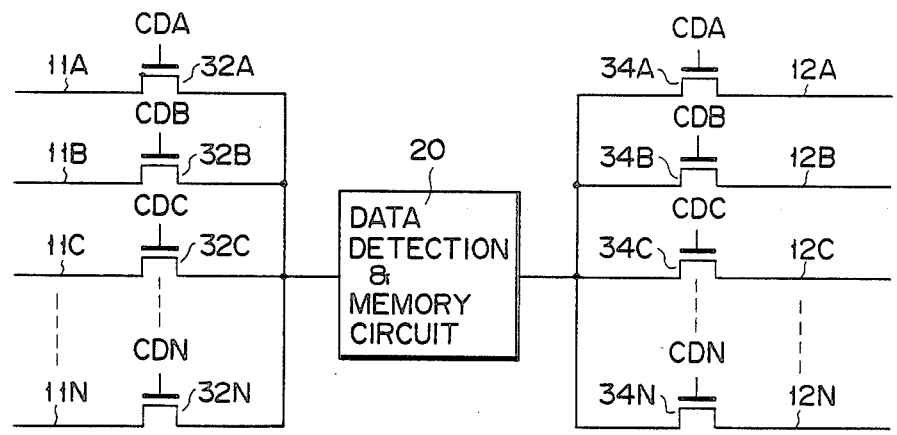

PROGRAMMABLE SEMICONDUCTOR MEMORY DEVICE WITH COMBINED SENSE AMPLIFICATION AND PROGRAMMING CAPABILITY

BACKGROUND OF THE INVENTION

This invention relates to a semiconductor memory device, more particularly, to an EEPROM (electrically erasable and programmable read only memory).

It is known that data can be read out of the EEPROM (hereinafter referred to as "the memory") generally at as high a speed as 100 nS to 200 nS. On the contrary, the writing of data in the memory can generally only occur at a speed between 1 mS to 50 mS. It has been found that the writing of data in parallel (i.e., a byte or a word) consumes almost as much time as the writing of an individual data bit, therefore the application of the parallel data-writing process can shorten data-writing time per byte. The length of time required to store one byte of data into a data storage is 200 nS, and the length of time required to transfer data from such a data storage to memory is about 1 mS. Therefore, the time required per byte, to store 16 bytes of data into memory as a unit will be (200 nS×16+1 mS)÷16, or about 63 μS. Consequently the possibility of writing data in an extremely short period, as described above, is of great importance in the sense that EEPROMs can be applied in a very broad field.

With the conventional memory which is provided with the aforementioned memory storage function and enables data to be erased and written again, it is generally the case that, the route through which data is written and the route through which data is read out are provided independently. Consequently, the conventional memory has the drawback that the circuit arrangement is unavoidably complicated.

The above-mentioned conventional memory possesses a function of externally indicating whether the erasing of data and the programming thereof has been brought to an end. This function is referred to as "a data polling function". The conventional memory is equipped with a special control circuit in order to carry out said data-polling function. However, in this respect, too, the conventional memory has the drawback of a complicated circuit arrangement.

SUMMARY OF THE INVENTION

This invention corrects the above-mentioned circumstances and is intended to provide a semiconductor memory device equipped with a circuit arrangement capable of efficiently carrying out the page mode write in the EEPROM.

According to the invention, there is provided a semiconductor memory device which comprises: a first bit line connected to memory cells each comprising a nonvolatile transistor and a dummy cell comprising a nonvolatile transistor; first and second high voltage generators respectively connected to said first and second bit lines; data-detecting and storing means which comprises a flip-flop circuit provided with first and second input-output nodes and, at the time of data reading, detects data while amplifying a potential difference between the first and second bit lines, and, at the time of data writing, temporarily stores data corresponding to the externally supplied writing data; a switching transistor provided between the first data input-output node of said data-detecting and storing means and said first bit line; and a switching transistor provided between the second data input-output node of said data-detecting and storing means and said second bit line.

According to the invention, there is further provided: a semiconductor memory device which comprises a first bit line connected to memory cells each comprising a nonvolatile transistor and a dummy cell comprising a nonvolatile transistor; a second bit line connected to memory cells, each comprising a nonvolatile transistor and a dummy cell comprising a nonvolatile transistor; first and second high voltage generating means respectively connected to said first and second bit lines; data-detecting and storing means comprising a flip-flop circuit provided with first and second data input-output node; a first switching transistor connected between the first data input-output node of said data-detecting and storing means and said first bit line; a second switching transistor connected between the second data input-output node of said data-detecting and storing means and said second bit line; data output-controlling means for controlling the external issue of data obtained from the first or second data input-output nodes of said data-detecting and storing means; a pair of data input transistors respectively connected between the first and second data input-output nodes of said data-detecting and storing means and a prescribed potential point; and data input control means for controlling said first and second data input transistors in accordance with the contents of externally supplied writing data.

BRIEF DESCRIPTION OF THE DRAWINGS

FIGS. 4A and 4B are timing charts illustrating the operation of the circuit in FIG. 1;

FIG. 5 sets forth the relative voltage levels of the various sections of the circuit in FIG. 1; and FIG. 6 shows a circuit for a modification of the preferred embodiment in FIG. 1.

DETAILED DESCRIPTION OF THE PREFERRED EMBODIMENT

Figure 1:
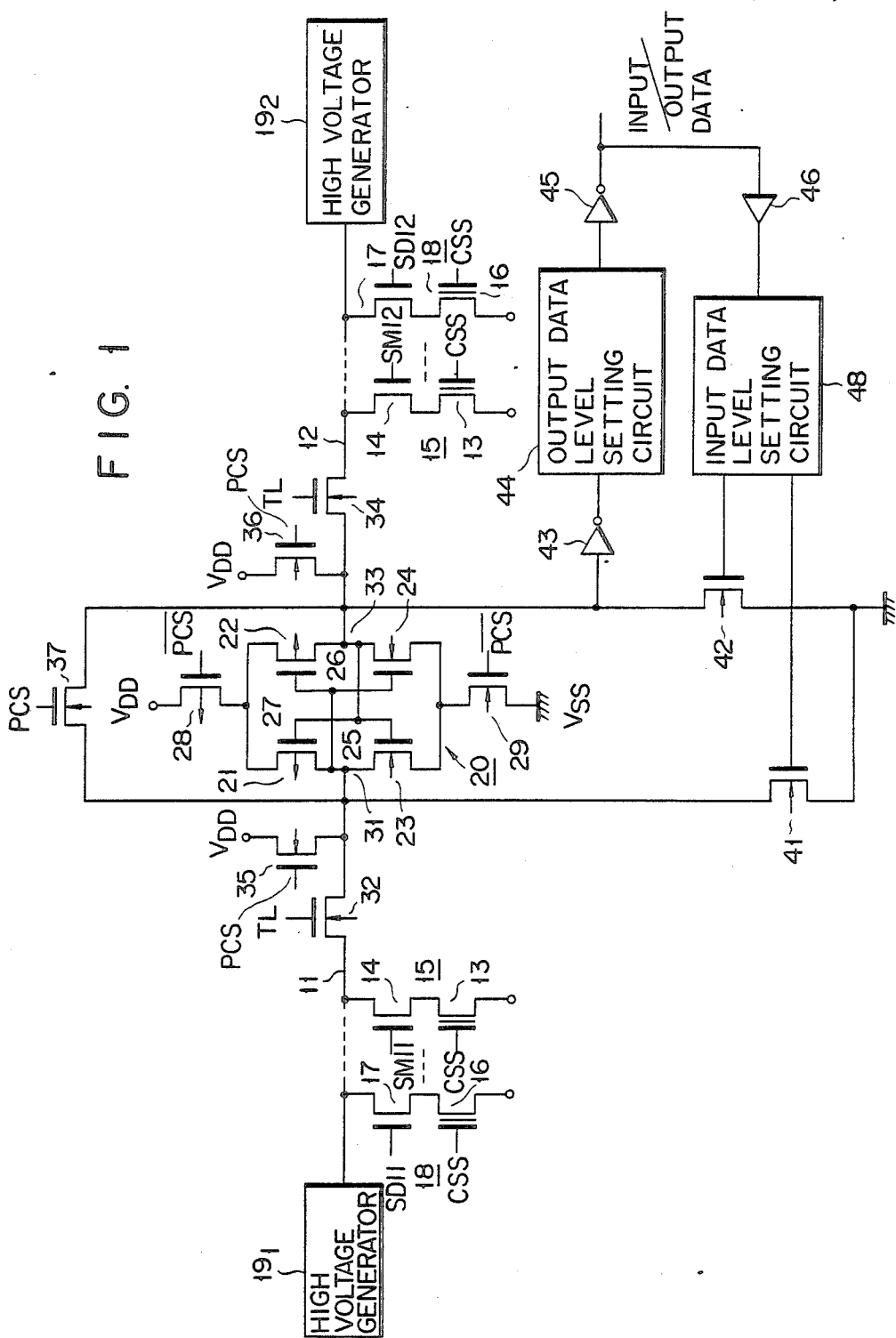
FIG. 1 represents a circuit arrangement of a semiconductor memory device embodying this invention.

The description will now be made with reference to the accompanying drawings of a semiconductor memory device embodying the present invention. Referring to FIG. 1, reference numerals 11, 12 correspond to bit lines. The bit line 11 is connected to a plurality of EEPROM type memory cells 15 (though only one unit is shown for briefness), each of which comprises a data-storing nonvolatile transistor 13 and selection transistor 14.

Also connected to the bit line 11 is one dummy cell 18 which comprises a selection transistor 17 and a data-storing nonvolatile transistor 16 which is designed to have a conductance halfway between the conductance of transistor 13 when the memory cell 15 stores "1" level data and the conductance of transistor 13 when memory cell 15 stores "0" level data. The bit line 12 is connected to memory cells of the same type as described above (though only one unit is set forth for briefness in FIG. 1), and also to one dummy cell 18 of the same arrangement as described above. Further connected to the bit lines 11, 12 are high voltage generators 19₁ and 19₂ which are used at the time of data programming.

A decoder (not shown) selects one of the aforementioned memory cells 15 connected to one of the bit lines 11, 12 and the dummy cell 18 connected to the other of the bit lines 11, 12. Specifically, when one of the memory cells 15 connected to the bit line 11 is selected, then the dummy cell 18 connected to the bit line 12 is selected. When, on the contrary, one of the memory cells 15 connected to the bit line 12 is selected, then the dummy cell 18 connected to the bit line 11 is selected. When the erasing and programming of data are carried out, the gate of the transistor 14 in the memory cell 15 connected to bit line 11 is supplied with a selection signal SM11 through a word line (not shown). The gate of transistor 14 in the memory cell 15 connected to bit line 12 is supplied with a selection signal SM12 through a word line (not shown). The gate of transistor 17 in the dummy cell 18 connected to bit line 11 is supplied with a selection signal SD11 through a word line (not shown). The gate of the transistor 17 in the dummy cell 18 connected to bit line 12 is supplied with a selection signal SD12 through a word line (not shown). The gates of the transistors 13 in the memory cells 15 connected to the bit lines 11 and 12 and the gates of the transistors 16 in the dummy cells 18 connected to the bit lines 11 and 12 are supplied with a common selection signal CSS.

Reference numeral 20 represents a circuit designed to detect a potential difference between the bit lines 11, 12 while amplifying said difference and also to temporarily store writing data supplied from an external device (not shown). The data-detecting and storing circuit 20 comprises a flip-flop circuit 27, P-channel MOS transistor 28 as a power source switch connected between a power source voltage $V_{DD}$ and the flip-flop circuit 27, and N-channel MOS transistor 29 as a power source switch connected between a power source voltage $V_{SS}$ and the flip-flop circuit 27. The flip-flop circuit 27 is constructed by connecting the input terminal of the CMOS inverter 25 comprising P-channel MOS transistor 21 and N-channel MOS transistor 23 and the output terminal of the CMOS inverter 26 comprising P-channel MOS transistor 22 and N-channel MOS transistor 24 and further connecting the output terminal of the CMOS inverter 25 to the input terminal of the CMOS inverter 26. The output terminal of the CMOS inverter 25 constitutes the data input-output node 31 of the data-detecting and storing circuit 20. The data input-output node 31 is connected to the bit line 11 through a transistor 32. The output terminal of the CMOS inverter 26 constitutes the data input-output node 33 of the data-detecting and storing circuit 20. The node 33 is connected to the bit line 12 through a transistor 34. Connected between the power source $V_{DD}$ and the nodes 31, 33 are precharge transistors 35, 36. Further connected between the nodes 31, 33 is a transistor 37 acting as an equalizing element. The gates of the transistors 35, 36, 37 are supplied with a common precharge control signal PCS.

Data-writing transistors 41, 42 are respectively connected between the power source $V_{SS}$ and the nodes 31, 33. The node 33 is connected to the input terminal of an inverter 43. When the data-detecting and storing circuit 20 detects a potential difference between the bit lines 11, 12, while amplifying said difference, the inverter 43 inverts the phase of data obtained at the node 33. Output data from the inverter 43 is supplied to an output data level-setting circuit 44. At the time of reading data, the output data level setting circuit 44 issues output data from the inverter 43 at the same level as it is delivered or at the inverted level, according to whether the memory cell 15 from which data is read out is connected to the bit line 11 or 12.

The control of the output data level is needed since without correction it is impossible to determine the correct data from the level detected. This is because the output for the data stored in a memory cell 15 connected to the bit line 11 and has a complementary level than the output for the same data stored in a memory cell 15 connected to the bit line 12. Therefore, it is necessary to invert the level of the output signals from the data-detecting and storing circuit 20 according to whether the selected memory cell 15 is connected to a bit line 11 or 12. An output data level-setting circuit 44 is provided for this specific object. The output data level-setting circuit 44 controls the data level according to the contents of an output from, for example, a decoder (not shown), according to whether the selected memory cell 15 is connected to the bit line 11 or 12. For example, the output data level-setting circuit 44 inverts the level of data which is read out of the memory cell 15 connected to the bit line 11 and does not invert the level of data which is read out of the memory cell 15 connected to the bit line 12. An output signal whose level has been controlled is issued to the outside through an output buffer 45.

Reference numeral 46 shows an input buffer for receiving write data supplied from the outside. An output of the input buffer 46 is delivered to an input data level-setting circuit 48. The input data level-setting circuit 48 receives the output data of buffer 46 and generates data of the same level as the buffer 46 output data and data in complementary form. The unchanged and complementary data are respectively supplied to the gates of the transistors 41, 42.

Figure 2:
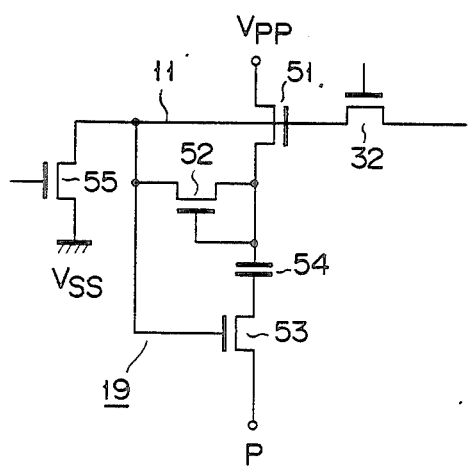
FIG. 2 concretely shows part of the circuit arrangement of the embodiment in FIG. 1.
Figure 3:
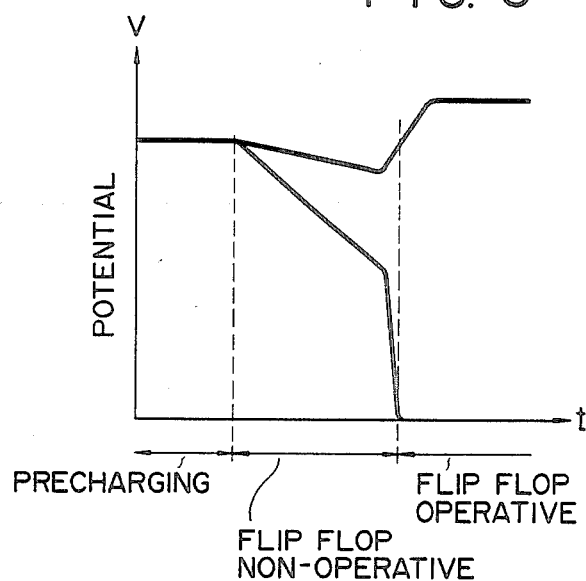
FIG. 3 is a graph showing the operation of the circuit arrangement of the embodiment of the invention shown in FIG. 1.

FIG. 2 indicates a concrete arrangement of the high voltage generator 19. The generator 19 comprises a charge pump type bootstrap circuit including transistors 51, 52, 53 and capacitor 54. The transistor 51 is impressed at one end with high voltage $V_{PP}$ of, for example, 20 volts. The transistor 53 is supplied at one end with a pulse signal P. Further, the high voltage generator 19 comprises a transistor 55 connected between the bit line 11 and power source voltage $V_{SS}$.

When, with the high voltage generator 19, the bit line 11 has an initial potential of 0 V, the transistor 51 is kept off and the bit line potential is kept at 0 V. If the bit line has an initial potential different from 0 V, then the potential is bootstrapped to a level approximating the source voltage $V_{PP}$ by the principle of the charge pump.

Though only one circuit unit is shown for briefness in FIG. 1, the semiconductor memory device embodying this invention comprises a plurality of circuits arranged as shown in FIG. 1. A description will now be made of the operation of the subject memory device.

At the time of data reading, the transistors 32, 34 are rendered conductive in advance by a read enable signal TL. As a result, the bit lines 11, 12 are connected to the data-detecting and storing circuit 20. When the contents of an address signal are changed, the transistors 35, 36, 37 are rendered conductive for a prescribed period of time. Consequently, the bit lines 11, 12 are precharged up of the source voltage $V_{DD}-V_{TH}$ and set at the same potential. $V_{TH}$ is a threshold voltage of the transistors 35 and 36.

After the completion of the precharge, the memory cell 15 and dummy cell 18 are selected according to a address signal. When a memory cell 15 connected to a bit line 11 is selected, then the dummy cell 18 connected to the bit line 12 is chosen, and conversely when a memory cell 15 connected to the bit line 12 is selected, then a dummy cell 18 connected to the bit line 11 is selected. After the precharge period, the potentials of bit lines 11, 12 drop. Since, however, the transistors 13, 16 of the selected memory cell 15 and the transistors 13, 16 of the dummy cell 18 have different conductances, the potentials of the bit lines 11, 12 drop in different degrees. When the potentials of the bit lines 11, 12 indicate a large difference, the transistors 28, 29 included in the data-detecting and storing circuit 20 are rendered conductive.

At this time the flip-flop circuit 31 is made ready for its operation. As a result, a potential difference between the bit lines 11, 12 rapidly increases, causing data read out of the memory cell 15 to be stored in a flip-flop circuit 27. If the transistor 13 of the memory cell 15 has a higher conductance than the transistor 16 of the dummy cell 18, then data is stored in the flip-flop circuit 27 while the bit line 11 is set at "0" and the bit line 12 is set at "1" level. Conversely when the transistor 13 of the selected memory cell 15 has a lower conductance than the transistor 16 of the dummy cell 18, then data is stored in the flip-flop circuit 27 while the bit line 11 is kept at "1" and the bit line 12 is kept at "1". Data stored in the flip-flop circuit 27 is level-inverted by the inverter 43. The level-inverted data is supplied to the setting circuit 40 and level-controlled therein in such a manner as described previously. The level-controlled data is issued to the outside through an output buffer 45.

A description will now be made of the operation of writing of data. In this case, data (FIG. 4B) to be written is supplied from the outside in synchronization with a write enable signal $\overline{WE}$ (FIG. 4A), as seen from the timing charts of FIGS. 4A and 4B. The transistors 32, 34 are rendered nonconductive in synchronization with the write enable signal $\overline{WE}$. As a result, the data-detecting and storing circuit 20 is electrically shut off from the bit lines 11, 12. The transistors 28, 29 included in the data-detecting and storing circuit 20 receive control signals PCS and $\overline{PCS}$ (inverted form of PCS), respectively, and are rendered conductive to actuate the flip-flop circuit 27. At this time, 1-bit data is supplied to the input data level setting circuit 48 through the input buffer 46. Similarly, in other circuit units (though not shown), 1-bit data are supplied to the respective input data level-setting circuits through the respective input buffers.

The input data level-setting circuit 48 generates a pair of complementary data from the supplied data. One of the transistors 41 and 42 is rendered conductive and the other is nonconductive in accordance with the contents of the paired complementary data. Now let it be assumed that "1" level data is written in a memory cell 15 connected to the bit line 11. Then, the input data level-setting circuit 48 supplies a "1" level signal to the gate of the transistor 41 and a "0" level signal to the gate of the transistor 42. As a result, the transistor 41 is rendered conductive, and the transistor 42 is rendered nonconductive. Thus the input-output node 31 of the flip-flop circuit 27 is set at "0" and the other input-output node 33 is set at "1".

Conversely when "0" level data is written in the memory cell 15 connected to the bit line 11, then the input data level-setting circuit 48 supplies a "0" level signal to the gate of the transistor 41 and a "1" level signal to the gate of the transistor 42. When the data-writing operation is carried out with respect to all the flip-flop circuits 27 (only one is shown in FIG. 1 for briefness), then the input data level-setting circuits 48 are stored with data to be written in the memory cell 15. Namely, the input data level-setting circuits 48 performs data storage in the page write mode.

FIG. 5 indicates the relationship of the levels of the voltages supplied to the transistors when data erasing and programming are performed with respect to the memory cell 15 shown in FIG. 1. D represents the voltage supplied to the drain of the selection transistor 14, namely, the bit line. SG denotes the voltage supplied to the gate of the selection transistor 14. CG shows the voltage supplied to the control gate of the transistor 13. S indicates the voltage supplied to the source of the transistor 13. When, in the data erase mode, the respective voltages are set at the following levels:

$D = 0$ V $SG = 20$ V $CG = 20$ V $S = 0$ V then the threshold voltage Vth of the nonvolatile transistor 13 is set at $+5$ V. At this time, the logic of stored data is set at a level "1". When, in the data programming mode, the respective voltages are at the following levels:

$D = 20$ V $SG = 20$ V $CG = 0$ V $S = 5$ V then the threshold voltage Vth of the nonvolatile transistor 13 is set at $-1$ V. At this time, the logic of the stored data is set at "0". The voltage levels of FIG. 5 are given simply as a guide, because the voltages noticeably vary with the design data of the subject memory device and process parameters.

While data is stored, as described above, in the data-detecting circuit 20, "1" level data is written in one memory cell 15 connected to, for example, the bit line 11 in the manner described below. First, the transistor 32 is rendered nonconductive and the transistor 55 (FIG. 2) is rendered conductive for a prescribed period of time, thereby causing the bit line to discharge toward the power source voltage $V_{SS}$. The gates of the transistors 13, 14 of the memory cell 15 in which data is to be written are impressed with a voltage of, for example, 20 V from external means (not shown). As a result, the threshold voltage Vth of the transistor 13 of the memory cell 15 is set at $+5$ V, thereby erasing data.

Thereafter, the transistors 32, 34 are rendered conductive and the bit lines 11, 12 are connected to the data-detecting and storing circuit 20. At this time the circuit 20 is supplied with data which causes the data input-output node 31 to be set at "1" and the data input-output node 33 to be set at "0". When, therefore, the transistors 32, 34 are rendered conductive, the bit line 11 is set at "1", and the bit line 12 is set at "0". Since the high voltage generator 19 carries out a bootstrapping of a potential of the bit line 11 now set at "1", the potential of said bit line 11 is raised to about 20 volts. When, therefore, the gate voltage of the transistor 14 involved in the memory cell 15 is set at 20 V and the control gate voltage of the transistor 13 at 0 V, then "0" level data can be written. Conversely when the data-detecting and storing circuit 20 is supplied with the data which sets the data input-output node 31 at "0", and the data input-output node 33 at "1", then the bit line 11 is set at "0". Therefore, voltage bootstrapping is not carried out in the high voltage generator 19 connected to the bit line 11. Even if, therefore, the gate voltage of the transistor 14 is set at 20 V, and the control gate voltage of the transistor 13 is set at 0 V, the threshold voltage Vth of the transistor 13 remains at +5 V, thereby causing "1" level data to still be stored in the memory cell 15. Since, at this time, the bit line 12 is set at "1", the high voltage generator 19 connected to the bit line 12 performs voltage bootstrapping. Since, however, none of the memory cells 15 connected to the bit line 12 is selected (the gate voltage of the selection transistor 14 is set at "0" volt), the data level does not change.

As mentioned above, the data-detecting and storing circuit 20 used in the semiconductor memory device of this invention is provided with a sense amplifier for detecting the potential difference between the bit lines 11, 12 and also with a data-storing function at the time of data writing. Since, with the present invention, it is possible to concurrently apply part of the data-writing circuit and data-reading circuit, the circuit arrangement is made simpler than in the case of the conventional semiconductor memory device where the data-writing circuit and data-reading circuit are independently provided.

Further, the circuit of the semiconductor memory device of the invention offers the advantage of easily effecting data polling. When "0" level data is read out of the memory cell 15, the bit line is set at "0". When, however, "0" level data is stored in the memory cell 15, it is necessary to set the bit line at "1" through the input data level-setting circuit 48 and transistors 41, 42. In the data-erasing or data programming mode, the level of the data supplied from the input buffer 46 is inverted from that of the data issued through the inverter 43, output data level-setting circuit 44 and output buffer 45. When, therefore, data reading is additionally carried out after data writing is brought to an end, and the level of the output data thus obtained is detected, and then judgment can be made as to whether data is in the process of being erased or programmed or the erasing or programming has been brought to an end. This is the data polling function of EEPROM. The circuit of the semiconductor memory device of this invention can perform this function without adding any other circuit.

Description may now be made of a modification of this invention with reference to FIG. 6. In an integrated circuit, the memory cell arrangement used, for example, in EEPROM, generally has a smaller area than the data-detecting and storing circuit 20. To increase the amount of integration, it is preferable to connect the data-detecting and storing circuit 20 to each of the paired bit lines 11, 12. With the modification (FIG. 6) of the subject semiconductor memory device, a common data-detecting and storing circuit 20 is provided for plural pairs of bit lines (11A–12A, 11B–12B, 11C–12C, . . . , 11N–12N). Further, transistor 32A is connected between the bit lines 11A and the common data-detecting and storing circuit 20. Transistor 32B is connected between the bit line 11B and the common data-detecting and storing circuit 20. Similarly transistors 32C–32N are connected between the corresponding bit lines 11C–11N and the common data-detecting and storing circuit 20.

Transistor 34A is connected between the bit line 12A and the common data-detecting and storing circuit 20. Transistor 34B is connected between the bit line 12B and the common data-detecting and storing circuit 20. Similarly transistors 34C–34N are connected between the corresponding bit lines 12C–12N and the common data-detecting and storing circuit 20. The transistors 32A–32N are controlled by the corresponding decoding signals CDA–CDN issued from a column decoder (not shown). Similarly, the transistors 34A–34N are controlled by the corresponding decoding signals CDA–CDN delivered from said column decoder.

With the modification of FIG. 6, the same operation as in the first embodiment of FIG. 1 is performed with respect to a column selected according to the contents of a given decoding signal. In the case of FIG. 6, the required chip area is reduced.

As mentioned above, this invention provides a semiconductor memory device provided with a circuit arrangement capable of efficiently carrying out the page mode write peculiar to EEPROM.

What is claimed is:
1. A programmable semiconductor memory device for storing input data comprising:
   a first bit line connected to first memory cells, each comprising a nonvolatile transistor for storing data, and a first dummy cell also comprising a nonvolatile transistor;
   a second bit line connected to second memory cells, each comprising a nonvolatile transistor for storing data, and a second dummy cell also comprising a nonvolatile transistor;
   high voltage generation means, connected to said first and second bit lines, for providing high voltage programming data for storage of said input data into said first and second memory cells and for erasing data from said first and second memory cells;
   data detecting and storing means for amplifying a potential difference between said first and second bit lines caused when one of said or first memory cells is selected and for temporarily holding data prior to storage into said first and second memory cells, the amplified potential difference between said first and second bit lines reflecting data stored in said selected one of said first or second memory cells, and said data detecting and storing means including a flip-flop having two input/output nodes;
   first switching means, connected between said first bit line and said first input/output node of said data detecting and storing means flip-flop for connecting said flip-flop to said first bit line in response to an enable signal;
   second switching means, connected between said second bit line and said second input/output node of said data detecting and storing means flip-flop, for connecting said flip-flop to said second bit line in response to said enable signal;
   signal compensation means for selectively inverting the level of said amplified potential difference ac- cording to whether said selected memory cell is connected to said first bit line or said second bit line; and data storage controlling means for controlling the storage of said input data into said first and second memory cells, said data storage controlling means comprising a first switching transistor having a gate receiving a first storage signal and having a current path connected between a predetermined potential and said first input/output node of said data detecting and storage means flip-flop, a second switching transistor having a gate receiving a second storage signal and having a current path connected between said predetermined potential and said input/output node of said data detecting and storing means flip-flop, and input data decoding means, coupled to the gates of said first and second transistors, for decoding said input data into said first storage signal having the same level as said input data and said second storage signal having a complementary level to said first storage signal.

2. The programmable semiconductor memory device of claim 1 wherein said first and second switching means include third and fourth switching transistors, respectively, which are rendered conductive by said enable signal when said data from said memory cell is amplified by said data detecting and storing means.

3. The programmable semiconductor memory device according to claim 1 wherein said first and second switching means include third and fourth transistors, respectively, which are rendered conductive for storing said input data into said first and second memory cells.

4. The semiconductor memory device of claim 1 wherein said first and second means include third and fourth switching transistors, respectively, which are rendered nonconductive by said enable signal when said first and second memory cells are erased.

5. The semiconductor memory device according to claim 1, further comprising a plurality of additional individual bit lines and wherein said data-detecting and storing means comprises a single circuit connected to all of said bit lines.

6. The semiconductor memory device according to claim 1 wherein each said first and second memory cell comprises a data-storing nonvolatile transistor and selection transistor for specifying said nonvolatile transistor.

* * * * *